US009025118B2

(12) United States Patent
Lee et al.

(10) Patent No.: US 9,025,118 B2
(45) Date of Patent: May 5, 2015

(54) DISPLAY SUBSTRATE AND METHOD OF MANUFACTURING THE SAME

(75) Inventors: Jung-Kyu Lee, Seoul (KR); Yoon-Ho Khang, Yongin-si (KR); Se-Hwan Yu, Seoul (KR); Cheol-Kyu Kim, Seoul (KR); Yong-Su Lee, Hwaseong-si (KR); Chong-Sup Chang, Hwaseong-si (KR); Sang-Ho Park, Suwon-si (KR); Su-Hyoung Kang, Bucheon-si (KR); Hyun-Jae Na, Seoul (KR); Young-Ki Shin, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 189 days.

(21) Appl. No.: 13/619,120

(22) Filed: Sep. 14, 2012

(65) Prior Publication Data
US 2013/0105826 A1 May 2, 2013

(30) Foreign Application Priority Data
Oct. 31, 2011 (KR) ........................ 10-2011-0111741

(51) Int. Cl.
G02F 1/136 (2006.01)
H01L 27/12 (2006.01)
G02F 1/1362 (2006.01)

(52) U.S. Cl.
CPC ........ H01L 27/124 (2013.01); G02F 1/136286 (2013.01); G02F 2001/13629 (2013.01); H01L 27/1288 (2013.01)

(58) Field of Classification Search
CPC ................... G02F 2001/13629; G02F 1/1345; G02F 1/136286; G02F 1/1343–2001/134381; G02F 2001/136231; G02F 2001/13236; H01L 27/124
See application file for complete search history.

(56) References Cited

U.S. PATENT DOCUMENTS

| | | | | | |
|---|---|---|---|---|---|
| 4,332,075 | A | * | 6/1982 | Ota et al. | 438/161 |
| 5,631,473 | A | * | 5/1997 | Possin et al. | 257/59 |
| 6,528,357 | B2 | * | 3/2003 | Dojo et al. | 438/151 |
| 7,166,864 | B2 | * | 1/2007 | Ahn et al. | 257/72 |
| 7,256,842 | B2 | * | 8/2007 | Hwang et al. | 349/38 |
| 7,349,038 | B2 | * | 3/2008 | Park et al. | 349/43 |
| 7,471,351 | B2 | * | 12/2008 | Choi | 349/54 |
| 7,599,014 | B2 | * | 10/2009 | Shih | 349/43 |
| 7,738,072 | B2 | * | 6/2010 | Wang et al. | 349/187 |
| 7,763,481 | B2 | * | 7/2010 | Yang et al. | 438/30 |
| 7,776,662 | B2 | * | 8/2010 | Wang et al. | 438/149 |

(Continued)

FOREIGN PATENT DOCUMENTS

| | | |
|---|---|---|
| JP | 2008072064 A | 3/2008 |
| KR | 1020080108821 A | 12/2008 |
| KR | 1020090016340 A | 2/2009 |

*Primary Examiner* — Steven J Fulk
*Assistant Examiner* — Eric Ward
(74) *Attorney, Agent, or Firm* — Cantor Colburn LLP

(57) ABSTRACT

A display substrate includes a base substrate, a switching element, a gate line, a data line and a pixel electrode. Each of the gate line and the data line includes a first metal layer, and a second metal layer directly on the first metal layer. The switching element is on the base substrate, and includes a control electrode and an input electrode or an output electrode. The control electrode includes the first metal layer and excludes the second metal layer, and extends from the gate line. The input electrode or the output electrode includes a second metal layer and excludes the first metal layer. The input electrode extends from the data line. The pixel electrode is electrically connected to the output electrode of the switching element through a first contact hole, and includes a transparent conductive layer.

11 Claims, 15 Drawing Sheets

(56) References Cited

U.S. PATENT DOCUMENTS

| | | | |
|---|---|---|---|
| 8,102,479 B2 * | 1/2012 | Song et al. | 349/43 |
| 8,143,624 B2 * | 3/2012 | Lin et al. | 257/72 |
| 2012/0043545 A1 * | 2/2012 | Kim et al. | 257/59 |

* cited by examiner

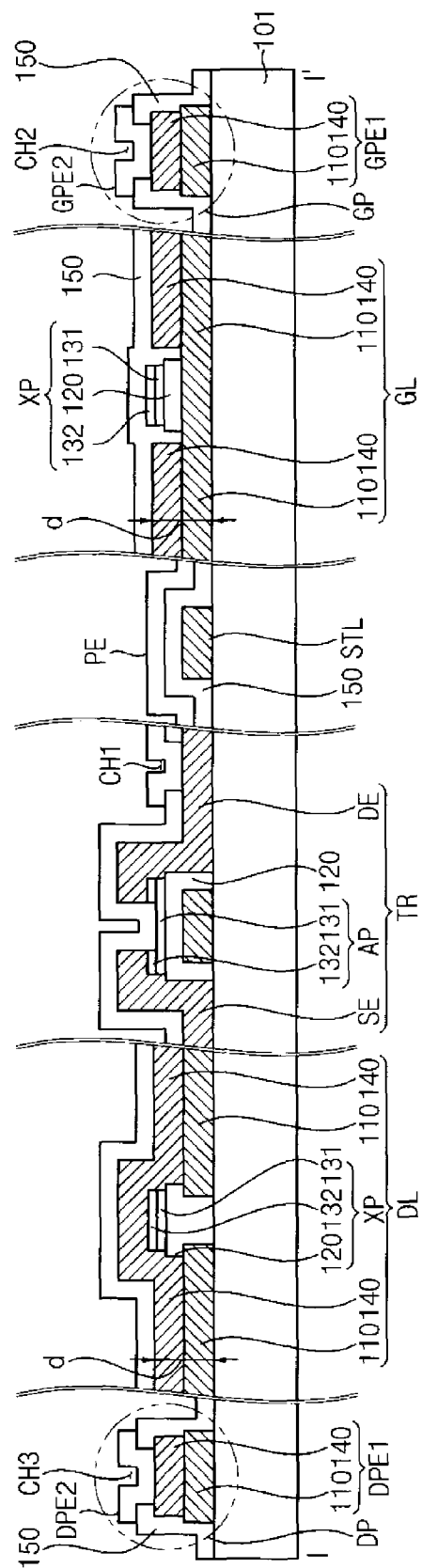

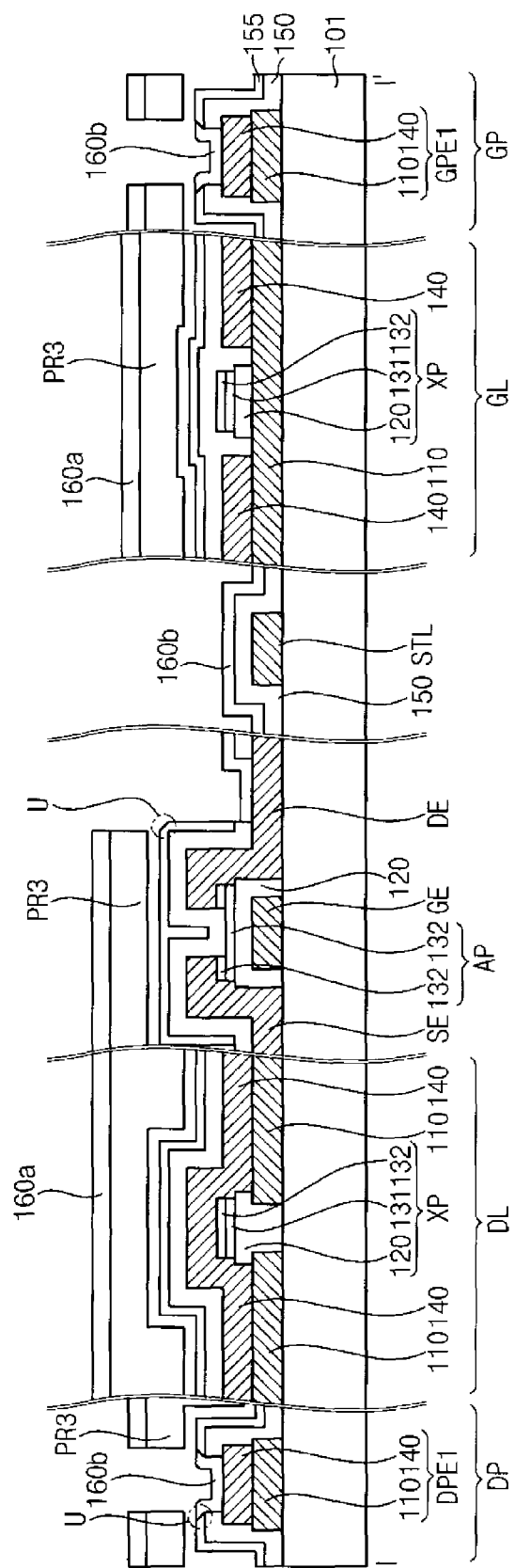

DISPLAY SUBSTRATE AND METHOD OF MANUFACTURING THE SAME

CROSS REFERENCE TO RELATED APPLICATION

This application claims priority to Korean Patent Application No. 10-2011-0111741, filed on Oct. 31, 2011, and all the benefits accruing therefrom under 35 U.S.C. §119, the contents of which are incorporated herein by reference in their entireties.

BACKGROUND OF THE INVENTION

1. Field of the Invention

Exemplary embodiments of the invention relate to a display substrate and a method of manufacturing the display substrate. More particularly, exemplary embodiments of the invention relate to a display substrate for forming a metal wiring having a low resistance and a method of manufacturing the display substrate.

2. Description of the Related Art

A liquid crystal display ("LCD") apparatus includes a thin-film transistor ("TFT") substrate, a color filter substrate combined with the TFT substrate, and a liquid crystal layer disposed between the TFT substrate and the color filter substrate. The TFT substrate includes a wiring, a TFT and a pixel electrode disposed on an insulating substrate, to drive a plurality of pixels independently. The color filter substrate includes a color filter layer having red, green and blue pixels, and a common electrode facing the pixel electrode.

As an LCD apparatus becomes larger and has higher resolutions, a charging capacity of the TFT and a driving margin of the TFT is desired. Thus, various wiring structures having a low resistance have been developed to minimize a resistance-capacitance ("RC") delay of a wiring formed on the TFT substrate.

A thick wiring having a relatively thick metal layer has been developed as low resistance wiring. A metal layer is deposited in a relatively large thickness on a glass substrate and then is patterned, so that the relatively thick wiring may be formed. However, there are limitations in depositing the relatively thick metal layer on the glass substrate. For example, as a thickness of the metal layer is increased, the glass substrate sags due to a processing stress. In addition, it is difficult to control a skew of a pattern during an etching process. For example, it is difficult to control the skew and a taper angle of the metal layer in forming a channel of a thin film transistor ("TFT") so that the TFT may be undesirably short-circuited.

BRIEF SUMMARY OF THE INVENTION

Exemplary embodiments of the invention provide a display substrate having a relatively thick metal wiring.

Exemplary embodiments of the invention also provide a method of manufacturing the display substrate.

According to an exemplary embodiment, a display substrate includes a base substrate, a switching element, a gate line, a data line and a pixel electrode. Each of the gate line and the data line includes a first metal layer, and a second metal layer directly on the first metal layer. The switching element is on the base substrate, and includes a control electrode, and an input electrode or an output electrode. The control electrode includes the first metal layer and excludes the second metal layer, and extends from the gate line. The input electrode or the output electrode includes the second metal layer and excludes the first metal layer. The input electrode extends from the data line. The pixel electrode is electrically connected to the output electrode of the switching element through a first contact hole, and includes a transparent conductive layer.

In an exemplary embodiment, a total thickness of each of the gate line and the data line may be substantially same as a sum of thicknesses of the first and second metal layers.

In an exemplary embodiment, the display substrate may further include an insulating pattern in a crossing area in which the gate and data lines cross each other, and may electrically insulate the gate line from the data line.

In an exemplary embodiment, the first metal layer of the gate line may continuously extend in the crossing area, and the second metal layer of the gate line may be disconnected by the insulating pattern in the crossing area.

In an exemplary embodiment, the first metal layer of the data line may be disconnected in the crossing area, and the second metal layer of the data line may continuously extend in the crossing area and overlap the insulating pattern.

In an exemplary embodiment, the switching element may further include an active portion on the control electrode. The active portion may include a planarizing layer in contact with the control electrode, and a semiconductor layer directly on the planarizing layer.

In an exemplary embodiment, the insulating pattern may include the planarizing layer, and the semiconductor layer directly on the planarizing layer.

In an exemplary embodiment, the display substrate may further include an ohmic contact layer directly on the semiconductor layer.

In an exemplary embodiment, the display substrate may further include a storage line overlapping the pixel electrode, and including the first metal layer and excluding the second metal layer.

In an exemplary embodiment, the display substrate may further include a data pad at an end portion of the data line. The data pad may include a first data pad electrode including the first metal layer, and the second metal layer directly on the first metal layer, and a second data pad electrode overlapping the first data pad electrode.

In an exemplary embodiment, the display substrate may further include a gate pad at an end portion of the gate line. The gate pad may include a first gate pad electrode including the first metal layer, and the second metal layer directly on the first metal layer, and a second gate pad electrode overlapping the first gate pad electrode.

According to another exemplary embodiment, a method of manufacturing a display substrate includes forming a control electrode of a switching element, a first layer of a gate line electrically connected to the control electrode and a first layer of a data line crossing the gate line on a base substrate, using a first metal layer, forming an insulating pattern in a crossing area of the base substrate in which the gate and data line cross each other, forming input and output electrodes of the switching element, a second layer of the data line electrically connected to the input electrode and directly on the first layer of the data line, and a second layer of the gate line directly on the first layer of the gate line on the base substrate, using a second metal layer, and forming a pixel electrode electrically connected to the output electrode of the switching element.

In an exemplary embodiment, the forming the insulating pattern may include sequentially stacking a planarizing layer and a semiconductor layer on the first layer of each of the gate line and the data line, and patterning the planarizing layer and the semiconductor layer to form an active portion on the control electrode and to form the insulating pattern in the crossing area.

In an exemplary embodiment, the first layer of the gate line may continuously extend in the crossing area, and the second layer of the gate line may be disconnected by the insulating pattern in the crossing area In an exemplary embodiment, the first layer of the data line may be disconnected in the crossing area, and the second layer of the data line may continuously extend in the crossing area and overlap the insulating pattern.

In an exemplary embodiment, the method may further include forming a storage line overlapping the pixel electrode, using the first metal layer.

In an exemplary embodiment, the method may further include forming a first data pad electrode including the first metal layer, and the second metal layer directly on the first metal layer, at an end portion of the data line, and forming a second data pad electrode overlapping the first data pad electrode In an exemplary embodiment, the method may further include forming a first gate pad electrode including the first metal layer, and the second metal layer directly on the first metal layer, at an end portion of the gate line, and forming a second gate pad electrode overlapping the first gate pad electrode.

In an exemplary embodiment, forming the pixel electrode may include forming a protecting layer on the second layer of each of the gate and data lines, patterning the protecting layer to form a contact hole through which the output electrode is exposed, forming a transparent conductive layer on the protecting layer through which the contact hole is formed, and patterning the transparent conductive layer to form a pixel electrode contacting the output electrode through the contact hole.

In an exemplary embodiment, forming the pixel electrode may include sequentially stacking a protecting layer and a sacrifice layer on the second layer of each of the gate and data lines, forming a contact hole through the protecting layer and the sacrifice layer, using a first photo pattern having a first thickness, and a second photo pattern having a second thickness less than the first thickness, forming a third photo pattern having a third thickness by etching back the first photo pattern, and removing the second photo pattern, forming an under-cut sidewall of the sacrifice layer adjacent to a side surface of the third photo pattern, forming a transparent conductive layer on the sacrifice layer including the under-cut sidewall, and removing the third photo pattern using the under-cut sidewall to form the pixel electrode.

According to the exemplary embodiments, a thick metal wiring includes a first metal layer, and second metal layer directly on the first metal layer, where a first metal layer excluding the second metal layer is a controlling electrode of a switching element, and a second metal layer excluding the first metal layer is an input or output electrode of the switching element, so that a problem due to a processing stress in forming the thick metal wiring may be reduced, and a wiring's resistance may be decreased.

BRIEF DESCRIPTION OF THE DRAWINGS

The above and other features and advantages of the invention will become more apparent by describing in detailed exemplary embodiments thereof with reference to the accompanying drawings, in which:

FIG. 2 is a cross-sectional view taken along line I-I' of FIG. 1;

FIG. 5A to FIG. 5C are cross-sectional views illustrating another exemplary embodiment of a method of manufacturing a display substrate according to the invention.

DETAILED DESCRIPTION OF THE INVENTION

Figure 1:
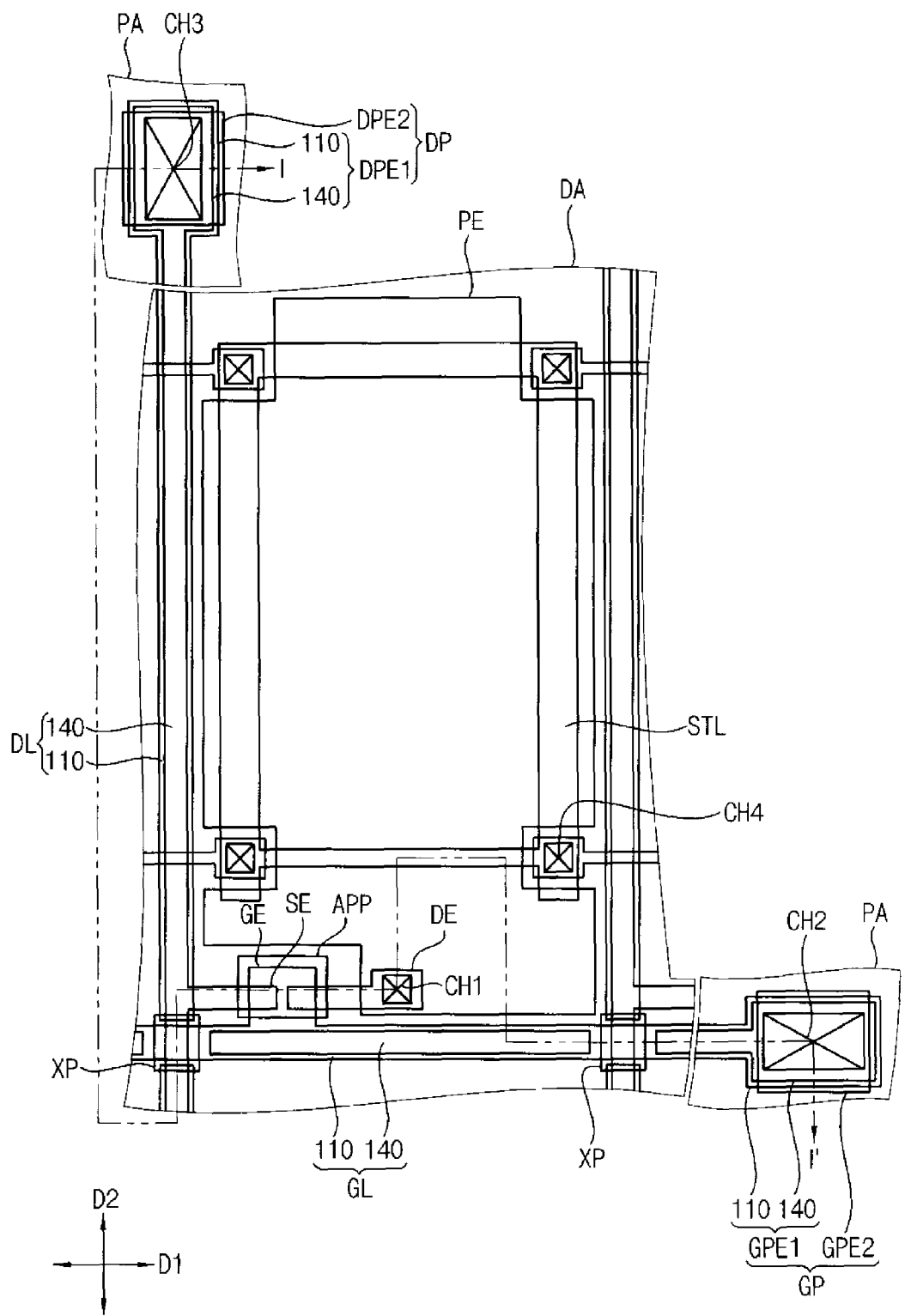
FIG. 1 is a plan view illustrating an exemplary embodiment of a display substrate according to the invention.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "above" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "beneath" relative to other elements or features would then be oriented "above" relative to the other elements or features. Thus, the exemplary term "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be explained in detail with reference to the accompanying drawings.

FIG. 1 is a plan view illustrating an exemplary embodiment of a display substrate according to the invention. FIG. 2 is a cross-sectional view taken along line I-I' of FIG. 1.

Referring to FIGS. 1 and 2, a display substrate includes a base substrate 101, a switching element TR, a gate line GL, a data line DL, an insulating pattern XP, a pixel electrode PE, a storage line STL, a data pad DP and a gate pad GP.

The base substrate 101 includes a display area DA, and a peripheral area PA surrounding the display area DA.

The switching element TR is disposed in the display area DA of the base substrate 101, and includes a control electrode GE, an active pattern AP, an input electrode SE and an output electrode DE. The control electrode GE includes a first metal layer 110, and the input and output electrodes SE and DE include a second metal layer 140. The active pattern AP is disposed on the control electrode GE, and may include a semiconductor layer 131 and an ohmic contact layer 132. A planarizing layer 120 is disposed between the active pattern AP and the control electrode GE. The input electrode SE includes the second metal layer 140, is electrically connected to the data line DL, and is partially overlapped with the active pattern AP. The output electrode DE includes the second metal layer 140, is spaced apart from the input electrode SE, is partially overlapped with the active pattern AP, and is electrically connected to the pixel electrode PE.

The gate line GL has a longitudinal axis which extends along a first direction D1 in the display area DA of the base substrate 101, and a plurality of the gate lines GL is arranged along a second direction D2 crossing the first direction D1. The gate line GL has the first and second metal layers 110 and 140 directly on each other.

The gate pad GP is disposed at an end portion of the gate line GL, and includes a first gate pad electrode GPE1 and a second gate pad electrode GPE2 which are connected with each other through a second contact hole CH2. The first gate pad electrode GPE1 has the first and second metal layers 110 and 140 directly making contact with each other, and the second gate pad electrode GPE2 includes a conductive layer same as the pixel electrode PE.

The data line DL has a longitudinal axis which extends along the second direction D2 in the display area DA of the base substrate 101, and a plurality of the data lines DL is arranged along the first direction D1. The data line DL has the first and second metal layers 110 and 140 directly on each other.

The data pad DP is disposed at an end portion of the data line DL, and includes a first data pad electrode DPE1 and a second data pad electrode DPE2 which are connected with each other through a third contact hole CH3. The first data pad electrode DPE1 has the first and second metal layers 110 and 140 directly making contact with each other, and the second data pad electrode DPE2 includes the conductive layer same as the pixel electrode PE.

The insulating pattern XP is disposed in an area in which the gate line GL and the data line DL cross each other, and electrically insulates the gate line GL from the data line DL. The insulating pattern XP includes a planarizing layer 120, the semiconductor layer 131 and the ohmic contact layer 132.

The pixel electrode PE is electrically connected to the output electrode DE of the switching element TR through a first contact hole CHL and is disposed in a preset pixel area in the display area DA.

The storage line STL includes the first metal layer 110, and is disposed to overlap with the pixel electrode PE. The storage line STL may be electrically connected to a storage line STL disposed in an adjacent pixel area via a connection portion, through a fourth contact hole CH4.

According to the exemplary embodiment, each of the first and second metal layers 110 and 140 may be deposited to have a thickness between about 5,000 angstroms (Å) and about 7,000 Å, to collectively form each of the gate and data lines GL and DL having a total thickness of about 10,000 Å. In addition, each of the first and second metal layers 110 and 140 may be deposited to have a thickness between about 10,000 Å and about 13,000 Å, to collectively form each of the gate and data lines GL and DL having a total thickness of about 20,000 Å. Problems, such as a layer stress (for example, a sag of a substrate), an etch profile and/or an etch skew of low resistance wiring, may be reduced or effectively prevented even with an increase of the total thickness of a deposited metal layer.

In addition, the electrodes GE, SE and DE of the switching element TR include the first metal layer 110 or the second metal layer 140, so that each of the electrodes GE, SE and DE may be thinner than each of the gate and data lines GL and DL. Accordingly, a skew and a taper angle are easily controlled in forming a channel, so that short-circuiting of a TFT may be reduced or effectively prevented. In addition, the active pattern AP is formed on only the control electrode GE, so that an advantage in a conventional five-mask process may be maintained.

FIG. 3A to FIG. 3E are plan views illustrating an exemplary embodiment of a method of manufacturing the display substrate of FIG. 1. FIG. 4A to FIG. 4E are cross-sectional views along line I-I' of FIG. 3A to FIG. 3E, respectively, illustrating the exemplary embodiment of the method of manufacturing the display substrate of FIG. 1.

Figure 3A:
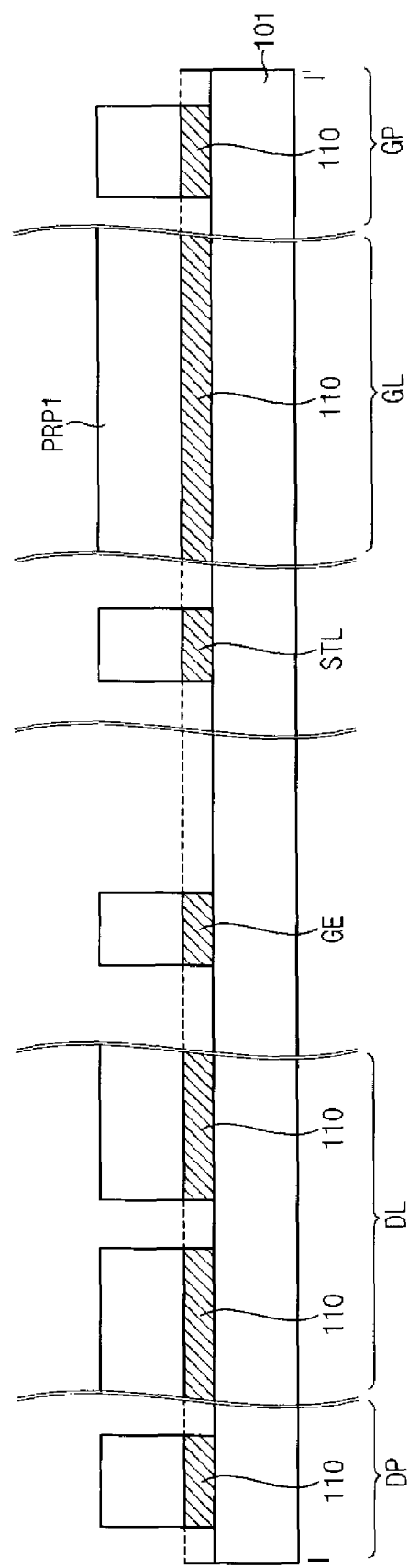
FIG. 3A to FIG. 3E are cross-sectional views illustrating an exemplary embodiment of a method of manufacturing the display substrate of FIG. 1.
Figure 4A:
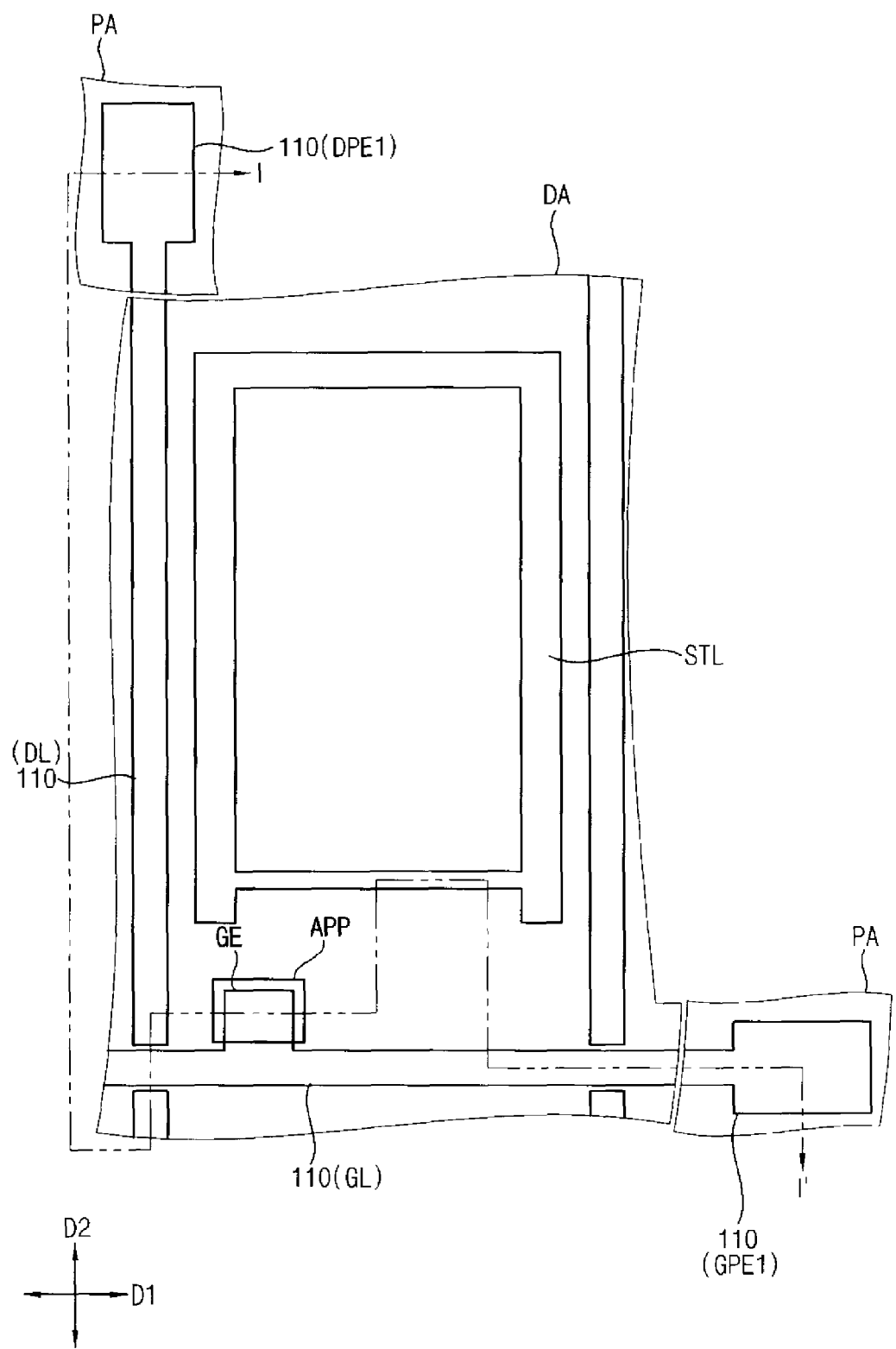
FIG. 4A to FIG. 4E are plan views along line I-I' of FIG. 3A to FIG. 3E, respectively, illustrating the exemplary embodiment of the method of manufacturing the display substrate of FIG. 1.

Referring to FIGS. 3A and 4A, the first metal layer 110 is disposed directly on the base substrate 101. The first metal layer 110 may be formed using a metal material, for example chrome, aluminum, tantalum, molybdenum, titanium, tungsten, copper, or silver, or an alloy thereof. In addition, the first metal layer 110 may be formed to have more than two layers which are physically different from each other. A first photoresist pattern PRP1 is disposed on the base substrate 101 on which the first metal layer 110 is previously disposed.

The first metal layer 110 is patterned to form a plurality of first metal patterns using the first photoresist pattern PRP1. The first metal patterns include the control electrode GE of the switching element TR, the storage line STL, a first metal layer 110 of the data line DL, a first metal layer 110 of the gate line GL, a first metal layer 110 of the first gate pad electrode GPE1, and a first metal layer 110 of the first data pad electrode DPE1. The first metal layer 110 of the gate line GL extends the first direction D1, and has a continuous structure along the first direction D1. The first metal layer 110 of the data line DL extends along the second direction D2, and has a discontinuous structure disconnected in an area in which the data line DL and the gate line GL cross each other.

Figure 3B:
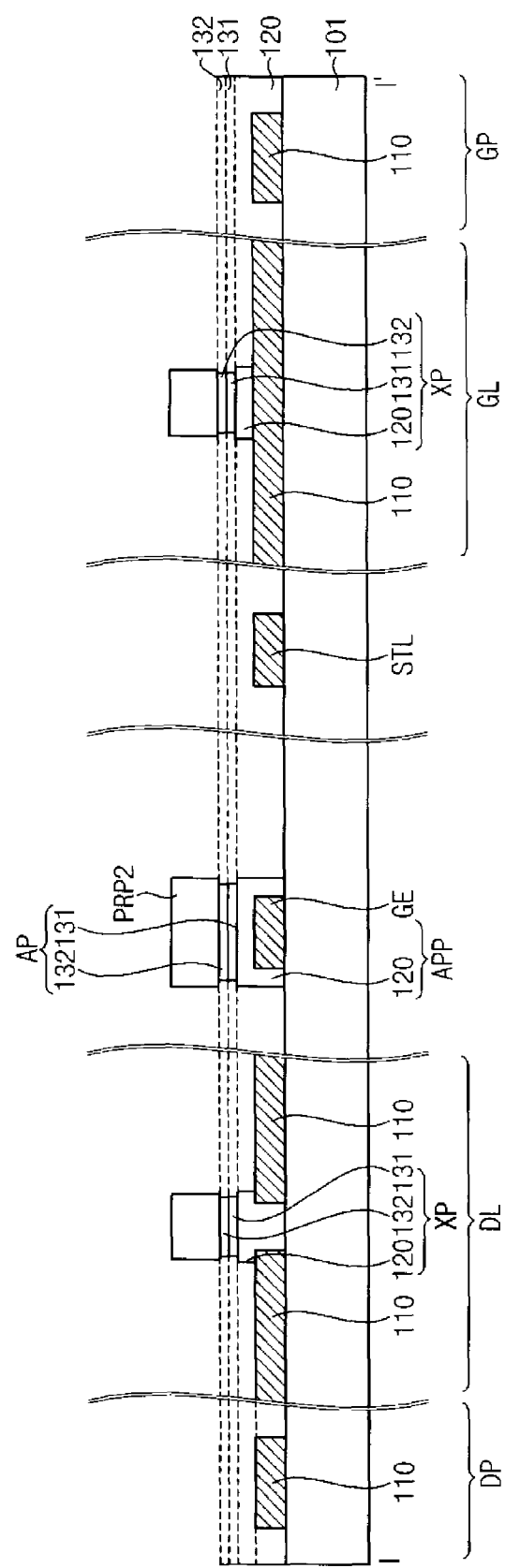
Figure 4B:
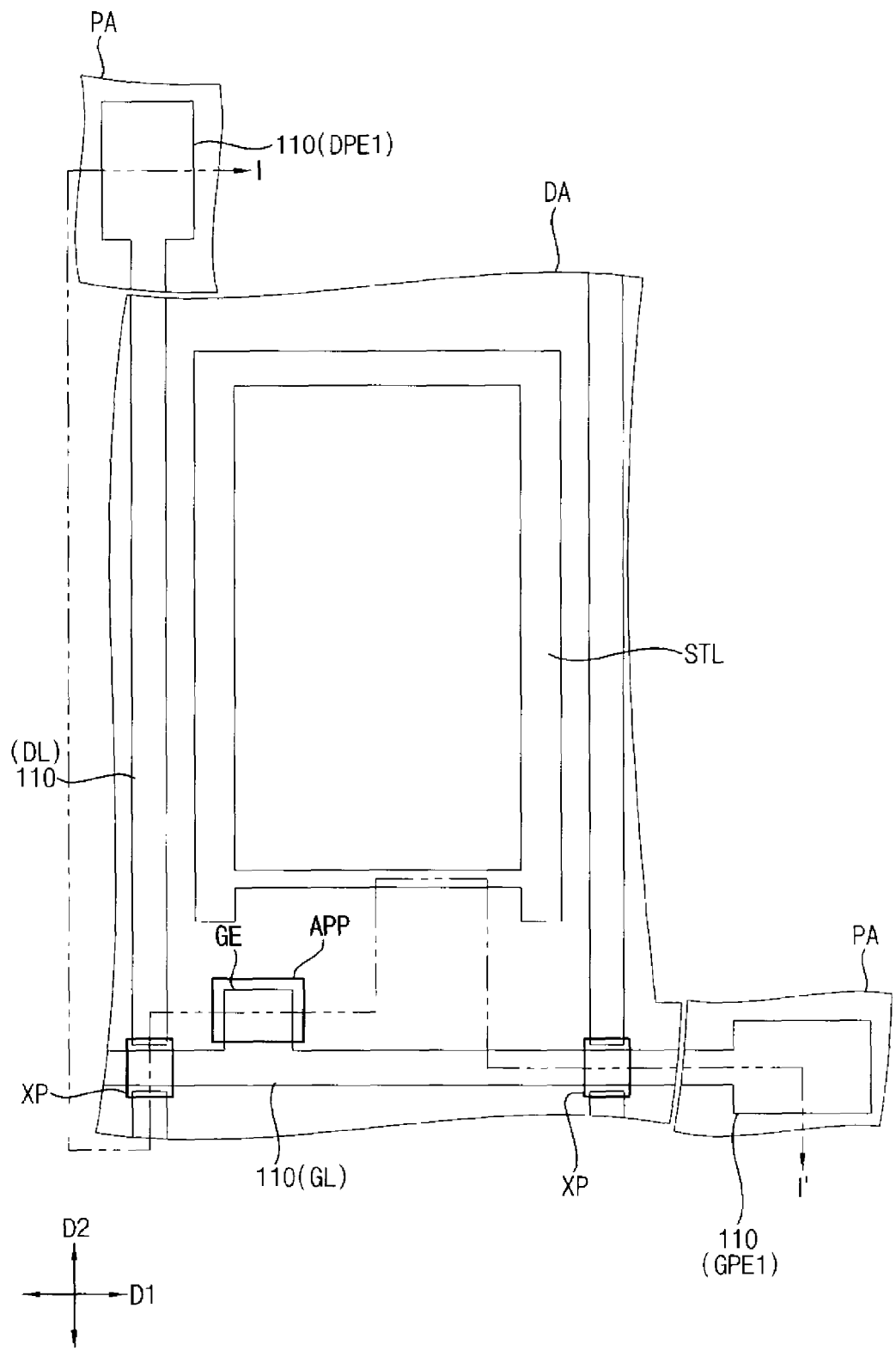

Referring to FIGS. 3B and 4B, a planarizing layer 120, a semiconductor layer 131 and an ohmic contact layer 132 are sequentially stacked on the base substrate 101 on which the first metal patterns are previously disposed. The planarizing layer 120 may be formed using a material including silicon oxide (SiOx), or silicon nitride (SiNx). The semiconductor layer 131 may include amorphous silicon (a-Si:H), and the ohmic contact layer 132 may include amorphous silicon doped with $n^+$ ($n^+$ a-Si:H).

A second photoresist pattern PRP2 is disposed on the base substrate 101 on which the ohmic contact layer 132 is previously disposed. The planarizing layer 120, the semiconductor layer 131 and the ohmic contact layer 132 are patterned to form an active portion APP and an insulating pattern XP using the second photoresist pattern PRP2.

The active portion APP includes the active pattern AP including the semiconductor layer 131 and the ohmic contact layer 132, and the planarizing layer 120 disposed between the control electrode GE and the active pattern AP.

According to an additional mask process for forming the active pattern AP, the active pattern AP may be selectively formed in an area in which the switching element TR is formed. Accordingly, protruding of an active pattern from sides of a data line which are formed in a four-mask process in which the data line and the active pattern are formed at the same time using the same mask, may be reduced or effectively prevented. Thus, problems due to the protruded active pattern, for example, a light leakage current, a parasitic capacitance and so on, may be solved.

The insulating pattern XP is disposed in an area in which the data line DL and the gate line GL cross each other in the plan view. The insulating layer XP is disposed between the first metal layers 110 of the data line DL spaced apart from each other in the plan view, and is disposed on and overlapping the gate line GL.

Figure 3C:
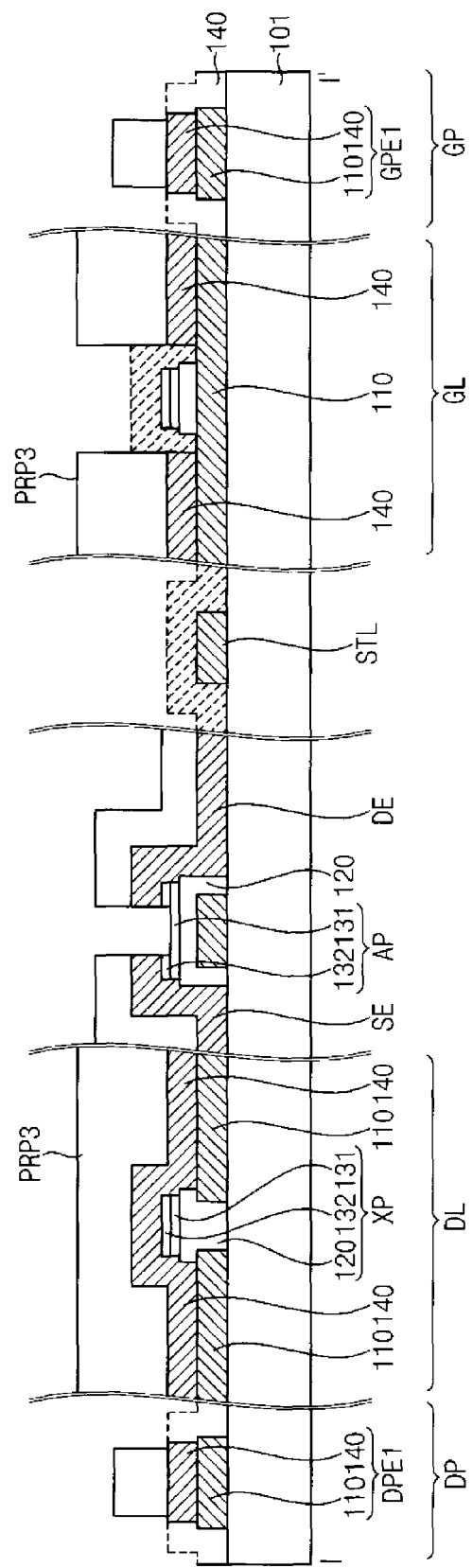
Figure 4C:
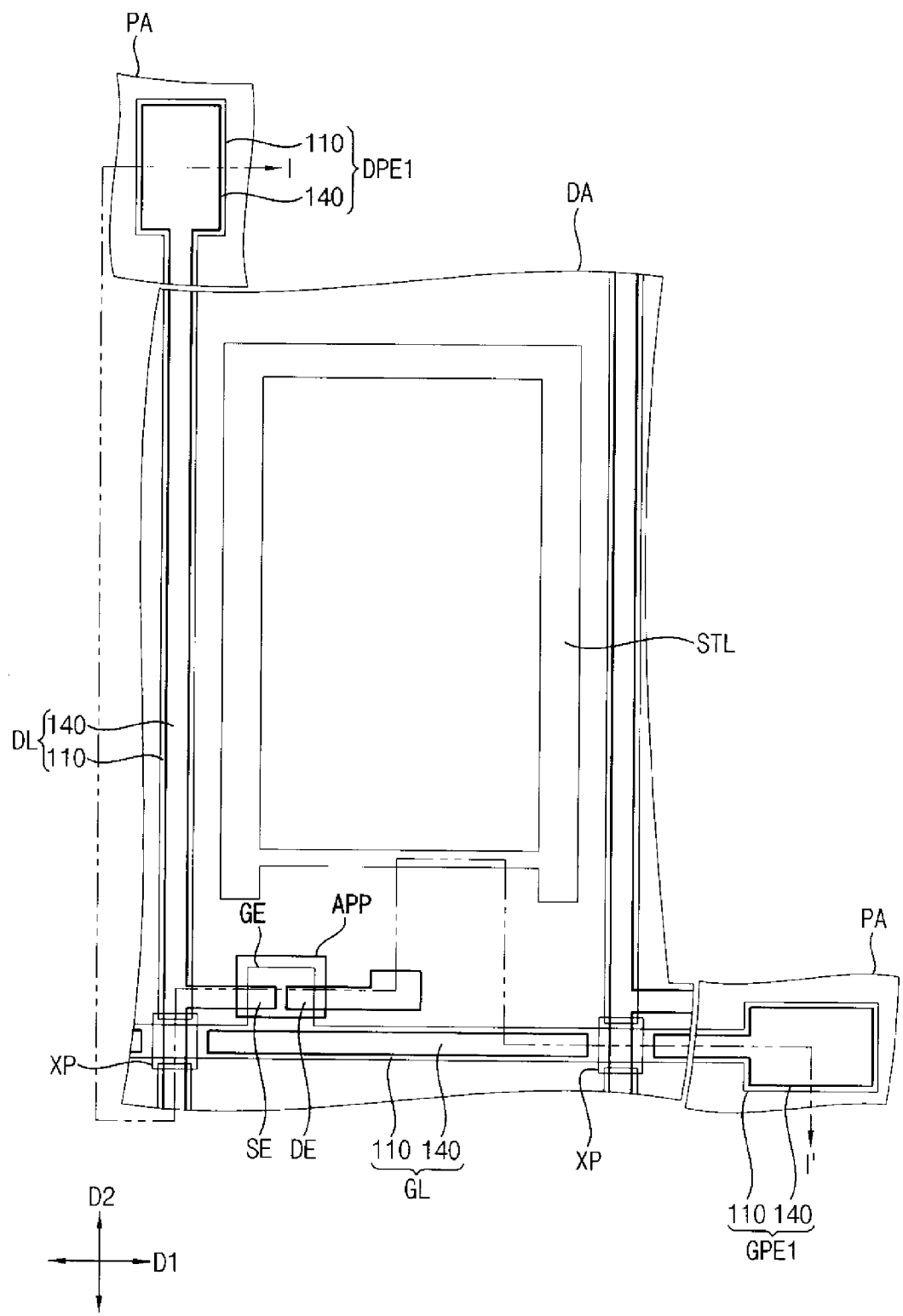

Referring to FIGS. 3C and 4C, a second metal layer 140 is disposed on the base substrate 101 on which the active portion APP and the insulating pattern XP are previously disposed. The second metal layer 140 may be formed using a metal material, such as chrome, aluminum, tantalum, molybdenum, titanium, tungsten, copper, or silver, or an alloy thereof. In addition, the second metal layer 140 may have more than two layers physically different from each other. A third photoresist pattern PRP3 is disposed on the base substrate 101 on which the second metal layer 140 is previously disposed. The second metal layer 140 is patterned to form a plurality of second metal patterns using the third photoresist pattern PRP3. The second metal patterns include the input and output electrodes SE and DE of the switching element TR, a second metal layer 140 of the data line DL, a second metal layer 140 of the gate line GL, a second metal layer 140 of the first gate pad electrode GPE1, a second metal layer 140 of the first data pad electrode DPE1. The second metal layer 140 of the gate line GL extends along the first direction D1, and has a discontinuous structure disconnected in an area in which the gate line GL and the data line DL cross each other. Thus, the insulating pattern XP is disposed in the area in which the gate line GL and the data line DL cross each other and is disposed between the second metal layers 140 of the gate line GL spaced apart from each other in the plan view. The second metal layer 140 of the data line DL extends along the second direction D2, and has a continuous structure along the second direction D2.

Accordingly, even if the second metal layer 140 of the gate line GL is disconnected in the area in which the gate line GL and the data line DL cross each other, the gate line GL may be operated as one wiring by the first metal layer 110 disposed beneath the second metal layer 140. In addition, even if the first metal layer 110 of the data line DL is disconnected in the area in which the gate line GL and the data line DL cross each other, the data line DL may be operated as one wiring by the second metal layer 140 disposed on the first metal layer 110.

Thus, each of the gate line GL and the data line DL may have a total thickness corresponding to a sum of thicknesses of the first and second metal layer 110 and 140 directly on each other.

Figure 3D:
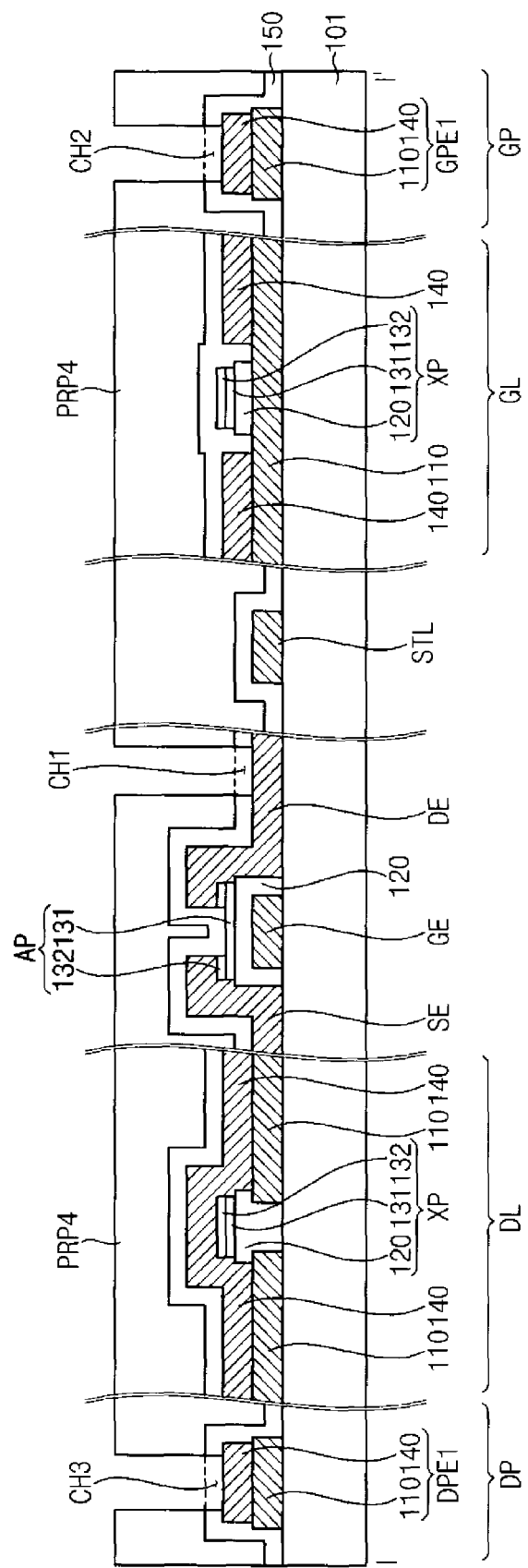
Figure 4D:
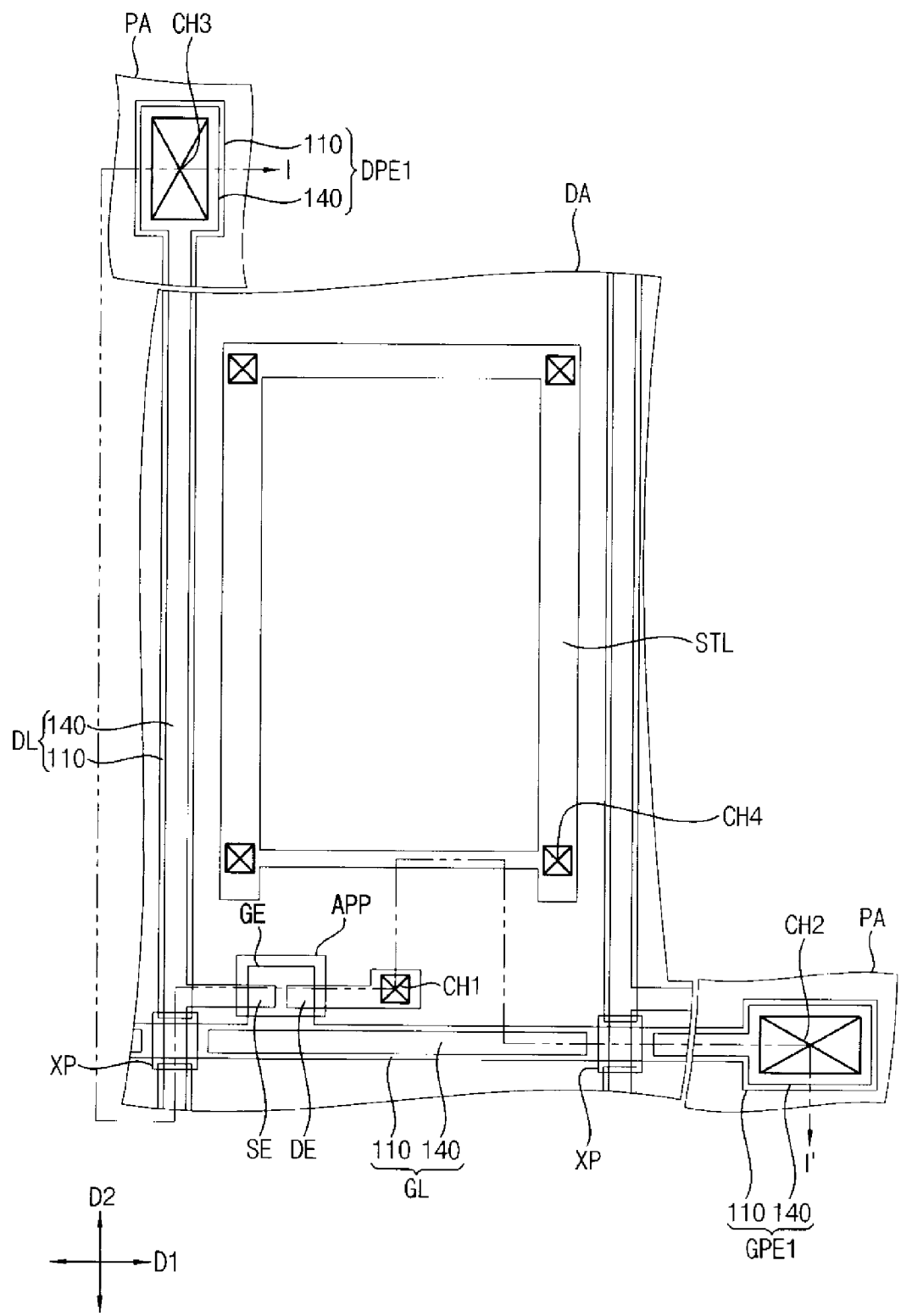

Referring to FIGS. 3D and 4D, a protecting layer 150 is disposed on the base substrate 101 on which the second patterns are previously disposed. The protecting layer 150 may be formed using a material including silicon oxide (SiOx), or silicon nitride (SiNx).

Although not shown in figures, a further planarizing layer may be disposed on the base substrate 101 on which the second metal patterns are disposed, and then the protecting layer 150 may be disposed on the further planarizing layer.

A fourth photoresist pattern PRP4 is disposed on the base substrate 101 on which the protecting layer 150 is previously disposed. First, second, third and fourth contact holes CH1, CH2, CH3 and CH4 are formed extending through an entire thickness of the protecting layer 150 using the fourth photoresist pattern PRP4. The first contact hole CH1 exposes the output electrode DE of the switching element TR. The second contact hole CH2 exposes the second metal layer 140 of the first gate pad electrode GPE1. The third contact hole CH3 exposes the second metal layer 140 of the first data pad electrode DPE1. The fourth contact hole CH4 exposes the storage line STL including the first metal layer 110.

Figure 3E:
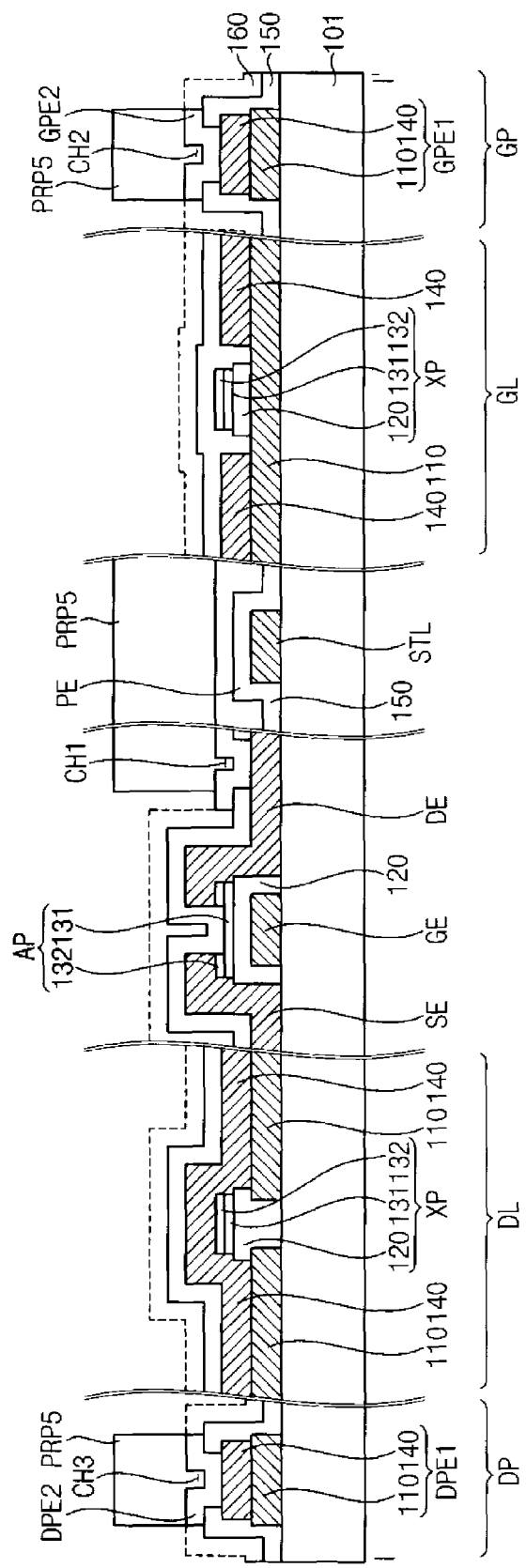
Figure 4E:
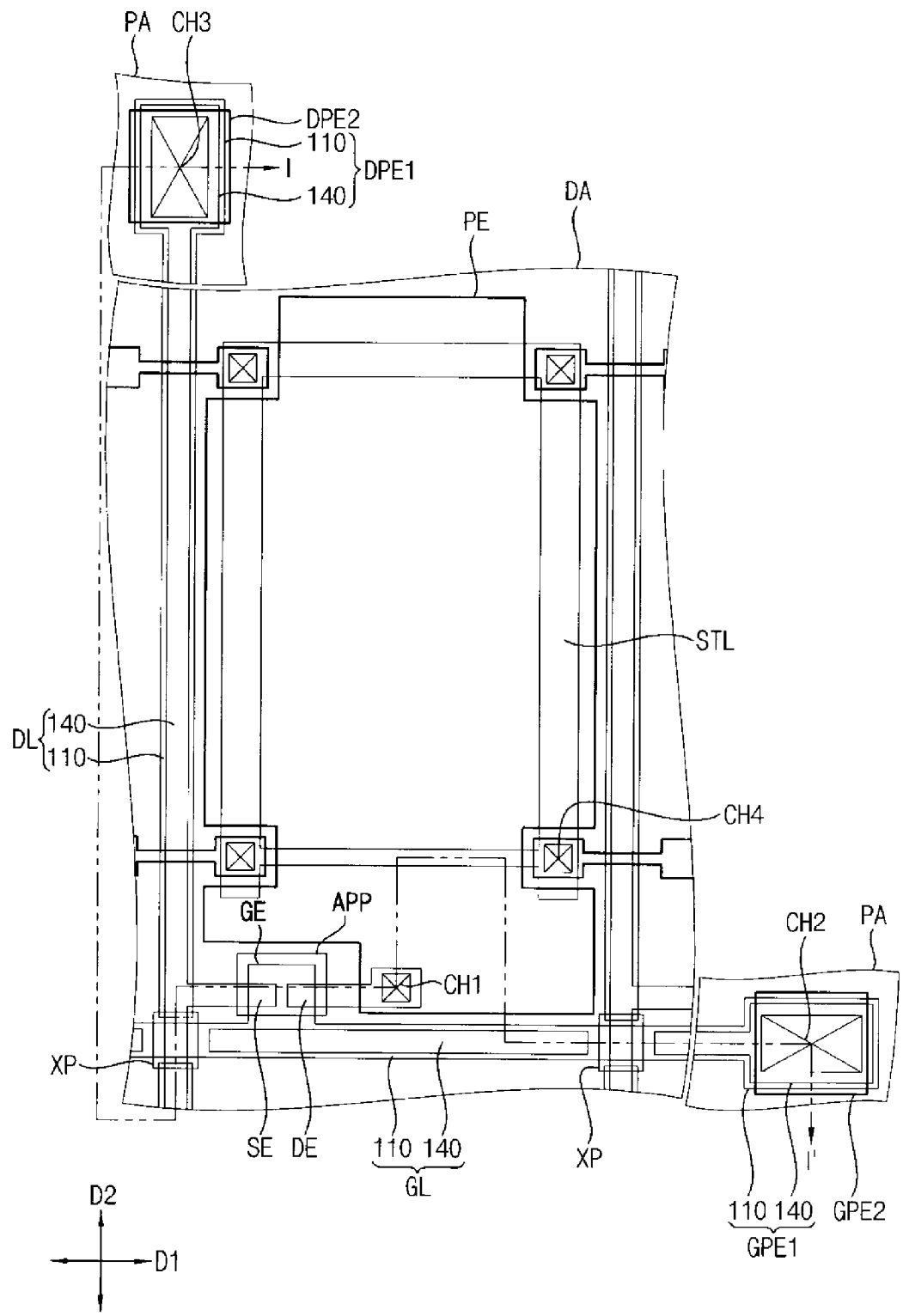

Referring to FIGS. 3E and 4E, a transparent conductive layer 160 is disposed on the base substrate 101 on which the first, second, third and fourth contact holes CH1, CH2, CH3 and CH4 are previously disposed. The transparent conductive layer 160 may include a transparent conductive material, for example indium tin oxide ("ITO"), or indium zinc oxide ("IZO"), and so on.

A fifth photoresist pattern PRP5 is disposed on the base substrate 101 on which the transparent conductive 160 is previously disposed. The transparent conductive 160 is patterned to form the pixel electrode PE, the second gate pad electrode GPE2 and the second data pad electrode DPE2 using the fifth photoresist pattern PRP5.

According to the exemplary embodiment, a method of manufacturing the display substrate may use first to fifth photoresist patterns PRP1 to PRP5 in a five-mask process.

Hereinafter, the same reference numerals will be used to refer to the same or like parts as those described in the foregoing exemplary embodiment and any further repetitive explanation concerning the above elements will be omitted.

Figure 5A:
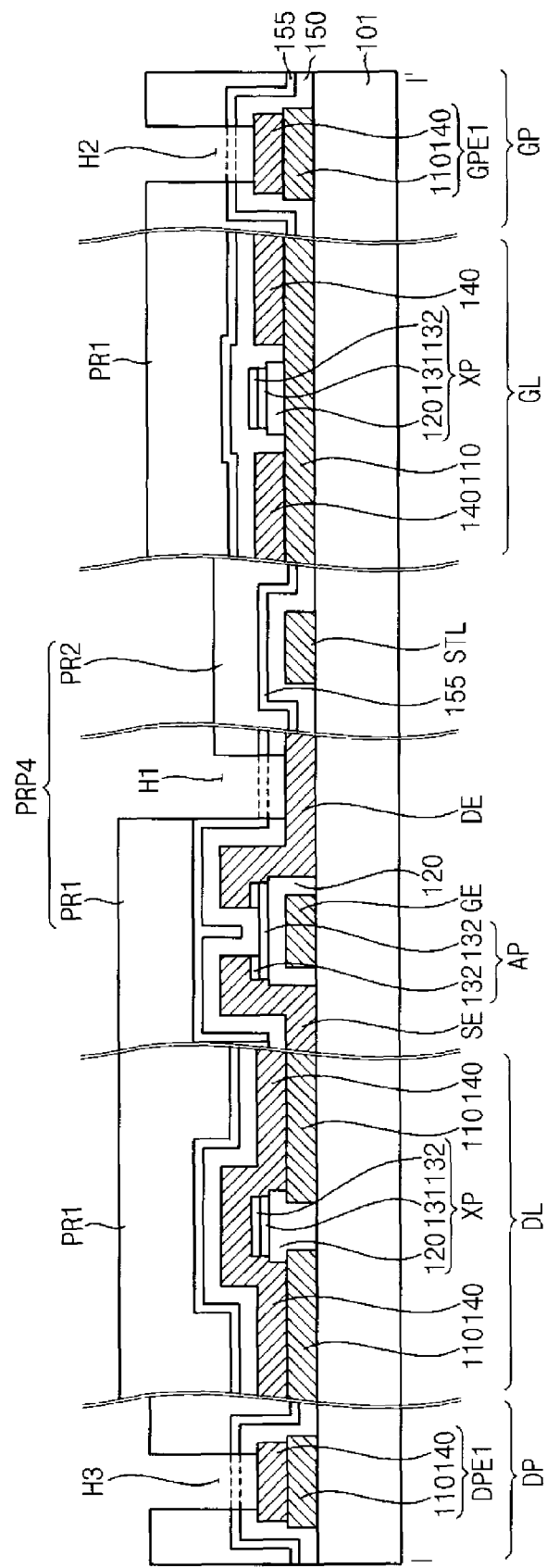
Figure 5B:
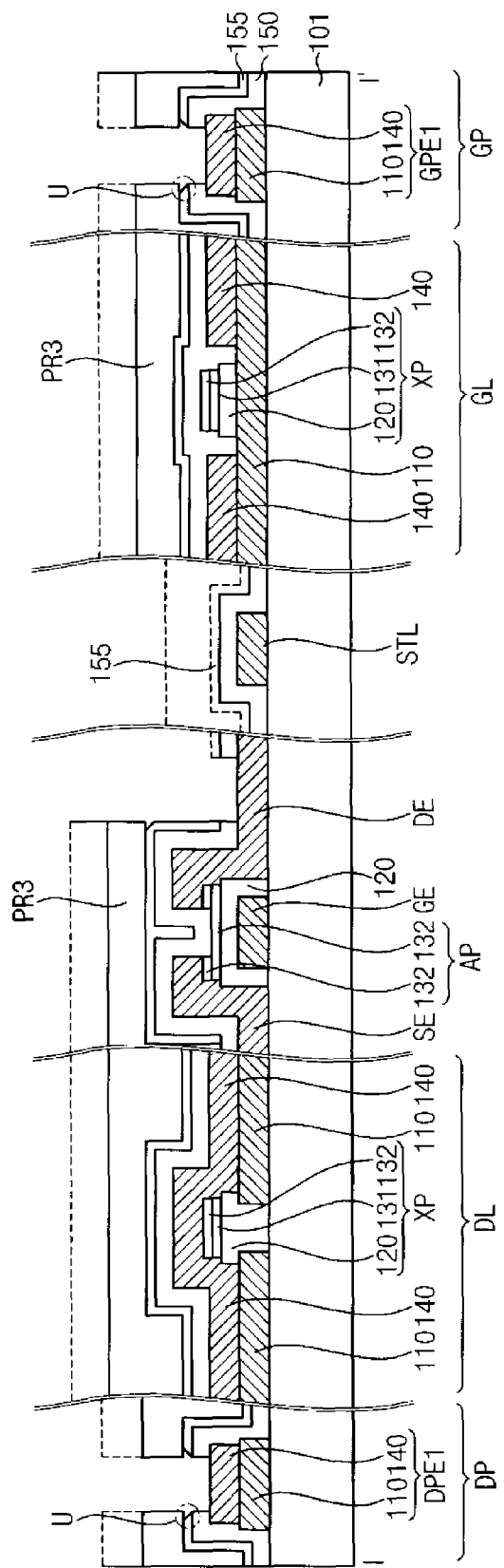

FIG. 5A to FIG. 5C are cross-sectional views illustrating another exemplary embodiment of a method of manufacturing a display substrate according to the invention.

In another exemplary embodiment of a method of manufacturing a display substrate according to the invention, the control electrode GE of the switching element TR, the storage line STL, a first metal layer 110 of the data line DL, a first metal layer 110 of the gate line GL, a first metal layer 110 of the first gate pad electrode GPE1, and a first metal layer 110 of the first data pad electrode DPE1 are formed on the base substrate 101, using the first photoresist pattern PRP1 as illustrated with reference to FIGS. 3A and 4A. The first metal layer 110 of the gate line GL extends along the first direction D1, and has a continuous structure along the first direction D1. The first metal layer 110 of the data line DL extends along the second direction D2, and has a discontinuous structure disconnected in an area in which the data line DL and the gate line GL cross each other.

As illustrated with reference to FIGS. 3B and 4B, the planarizing layer 120, the semiconductor layer 131 and the ohmic contact layer 132 are patterned to form an active portion APP and an insulating pattern XP on the base substrate 101 using the second photoresist pattern PRP2. The active portion APP includes the active pattern AP including the semiconductor layer 131 and the ohmic contact layer 132, and the planarizing layer 120 disposed between the control electrode GE and the active pattern AP. The insulating pattern XP is disposed in an area in which the data line DL and the gate line GL cross each other. The insulating layer XP is disposed between the first metal layers 110 of the data line DL spaced apart from each other, and is disposed on the first metal layer 110 of the gate line GL.

As illustrated with reference to FIGS. 3C and 4C, the input and output electrodes SE and DE of the switching element TR, a second metal layer 140 of the data line DL, a second metal layer 140 of the gate line GL, a second metal layer 140 of the first gate pad electrode GPE1, a second metal layer 140 of the first data pad electrode DPE1 are formed on the base substrate 101 on which the active pattern APP and the insulating pattern XP are previously formed, using the third photoresist pattern PRP3. The second metal layer 140 of the gate line GL extends along the first direction D1, and has a discontinuous structure disconnected in an area in which the gate line GL and the data line DL cross each other. Thus, the insulating pattern XP is disposed in the area in which the gate line GL and the data line DL cross each other, and is disposed between the second metal layers 140 of the gate line GL spaced apart from each other. The second metal layer 140 of the data line DL extends along the second direction D2, and has a continuous structure along the second direction D2.

Thus, each of the gate line GL and the data line DL may have a total thickness corresponding to a sum of thicknesses of the first and second metal layer 110 and 140 stacked on each other.

Referring to FIGS. 5A, 4D and 4E, the protecting layer 150 and a sacrifice layer 155 are sequentially stacked on the base substrate 101 on which the gate and data lines having a structure stacked with the first and second metal layer 110 and 140 are previously formed.

A fourth photoresist pattern PRP4 is disposed on the base substrate 101 on which the sacrifice layer 155 is previously disposed. The fourth photoresist pattern PRP4 includes a first photo pattern PR1 having a first thickness, and a second photo pattern PR2 having a second thickness less than the first thickness, and includes first to third holes H1, H2 and H3 and fourth hole (not shown) corresponding to the first to fourth contact holes CH1, CH2, CH3 and CH4, respectively. The first photo pattern PR1 may be disposed in an area in which the transparent conductive layer 160 is not formed, and the second photo pattern PR2 may be disposed corresponding to an area in which the pixel electrode PE is disposed.

The first to fourth contact holes CH1, CH2, CH3 and CH4 are formed by removing the protecting layer 150 and the sacrifice layer 155 using the fourth photoresist pattern PRP4. The first contact hole CH1 exposes the output electrode DE of the switching element TR. The second contact hole CH2 exposes the second metal layer 140 of the first gate pad electrode GPE1. The third contact hole CH3 exposes the second metal layer 140 of the first data pad electrode DPE1. The fourth contact hole CH4 exposes the storage line STL formed from the first metal layer 110.

Referring to FIGS. 5B, 4D and 4E, respective predetermined thicknesses of the first and second photo patterns PR1 and PR2 are removed using an etch-back process, so that an entire thickness of the second photo pattern PR2 is removed and a partial thickness of the first photo pattern PR1 is removed to form a third photo pattern PR3 having a third thickness. Accordingly, the third photo pattern PR3 is disposed in an area in which the transparent conductive layer 160 is not formed on the display substrate. The sacrifice layer 155 is dry-etched using the third photo pattern PR3.

Thus, the dry-etching described above removes an entire thickness of the sacrifice layer 155 on the base substrate which is exposed through the third photo pattern PR3. In addition, an under-cut sidewall U is formed at a sidewall of the sacrifice layer 155 remaining disposed under the third photo pattern PR3 at the second contact hole CH2.

Referring to FIGS. 5C, 4D and 4E, a transparent conductive layer 160 is disposed on the base substrate 101 on which the sacrifice layer 155 including the third photo pattern PR3 and the under-cut sidewall U are previously disposed.

The transparent conductive layer 160 includes a first transparent conductive pattern 160a disposed directly on the third photo pattern PR3, and a second transparent conductive pattern 160b separated from the first transparent conductive pattern 160a by the under-cut sidewall U. The second transparent conductive pattern 160b is formed to finally be the pixel electrode PE, the second gate pad electrode GPE2 and the second data pad electrode DPE2 by a following process.

In one exemplary embodiment, for example, the third photo pattern PR3, and the first transparent conductive pattern 160a formed on the third photo pattern PR3, are removed in lifting off the base substrate 101 on which the first and second transparent conductive patterns 160a and 160b are disposed. In one exemplary embodiment, for example, the base substrate 101 is immersed in a photoresist stripper. The photoresist stripper permeates into the third photo pattern PR3 through the under-cut sidewall U and thus the third photo pattern PR3 is lifted off. Accordingly, the third photo pattern PR3, and the first transparent conductive pattern 160a disposed on the third photo pattern PR3, are removed at the same time.

Thus, as shown in FIGS. 2 and 4E, the pixel electrode PE making contact with the output electrode DE through the first contact hole CH1, the second gate pad electrode GPE2 making contact with the first gate pad electrode GPE1 through the second contact hole CH2, and the second data pad electrode DPE2 making contact with the first data pad electrode DPE1 through the third contact hole CH3 are formed on the base substrate 101.

According to the exemplary embodiment, the contact holes CH1, CH2, CH3 and CH4 and the transparent conductive layer 160 may be formed using the fourth photoresist pattern PRP4 which has different thickness and is formed through a slit mask or a halftone mask. Thus, the display substrate may be formed using a four-mask process of the exemplary embodiment of the method shown in FIGS. 5A-5C according to the invention, which means that the number of the processes is decreased compared to that in the previous exemplary embodiment.

According to the exemplary embodiment, each of the first and second metal layers 110 and 140 may be deposited to have a thickness between about 5,000 Å and about 7,000 Å, to form each of the gate and data lines GL and DL having a total thickness of about 10,000 Å. In addition, each of the first and second metal layers 110 and 140 may be deposited to have a thickness between about 10,000 Å and about 13,000 Å, to form each of the gate and data lines GL and DL having a total thickness of about 20,000 Å. Problems, such as a layer stress (for example, a sag of a substrate), an etch profile and an etch skew, may be reduced or effectively prevented even with an increase of the total thickness of a deposited metal layer.

In addition, the electrodes GE, SE and DE of the switching element TR are formed using either the first metal layer 110 or the second metal layer 140, so that each of the electrodes GE, SE and DE may be thinner than each of the gate and data lines GL and DL. Accordingly, a skew and a taper angle are easily controlled in forming a channel, so that short-circuiting of a TFT may be reduced or effectively prevented. In addition, the active pattern AP is formed on only the control electrode GE, so that an advantage in a conventional five-mask process may be maintained.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
   a base substrate;
   a gate line comprising a first metal layer, and a second metal layer directly on the first metal layer;
   a data line crossing the gate line, and comprising the first metal layer, and the second metal layer directly on the first metal layer;
   a switching element on the base substrate, and comprising a control electrode, and an input electrode or an output electrode,
   the control electrode comprising the first metal layer and excluding the second metal layer, and extending from the gate line,
   the input electrode or the output electrode comprising the second metal layer and excluding the first metal layer, the input electrode extending from the data line; and
   a pixel electrode which is electrically connected to the output electrode of the switching element through a first contact hole, and comprises a transparent conductive layer.

2. The display substrate of claim 1, wherein a total thickness of each of the gate line and the data line is substantially the same as a sum of thicknesses of the first and second metal layers.

3. The display substrate of claim 1, further comprising:
   an insulating pattern in a crossing area in which the gate and data lines cross each other,
   wherein the insulating pattern electrically insulates the gate line from the data line.

4. The display substrate of claim 3, wherein
   the first metal layer of the gate line continuously extends in the crossing area and overlaps the insulating pattern, and
   the second metal layer of the gate line is disconnected by the insulating pattern in the crossing area.

5. The display substrate of claim 4, wherein
   the first metal layer of the data line is disconnected by the insulating pattern in the crossing area, and
   the second metal layer of the data line continuously extends in the crossing area and overlaps the insulating pattern.

6. The display substrate of claim 3, wherein the switching element further comprises an active portion on the control electrode, and the active portion comprises:
   a planarizing layer which contacts the control electrode, and
   a semiconductor layer directly on the planarizing layer.

7. The display substrate of claim 6, wherein the insulating pattern comprises the planarizing layer, and the semiconductor layer directly on the planarizing layer.

8. The display substrate of claim 7, further comprising:
   an ohmic contact layer directly on the semiconductor layer.

9. The display substrate of claim 1, further comprising:
   a storage line overlapping the pixel electrode and comprising the first metal layer excluding the second metal layer.

10. The display substrate of claim 1, further comprising:
    a data pad at an end portion of the data line, wherein the data pad comprises:
    a first data pad electrode comprising the first metal layer, and the second metal layer directly on the first metal layer, and
    a second data pad electrode overlapping the first data pad electrode.

11. The display substrate of claim 10, further comprising:
    a gate pad at an end portion of the gate line, wherein the gate pad comprises:
    a first gate pad electrode comprising the first metal layer, and the second metal layer directly on the first metal layer, and
    a second gate pad electrode overlapping the first gate pad electrode.

* * * * *